（12）United States Patent
Pease et al.

(10) Patent No.: US 6,906,305 B2
(45) Date of Patent: Jun. 14, 2005

(54) SYSTEM AND METHOD FOR AERIAL IMAGE SENSING

(75) Inventors: R. Fabian W. Pease, Stanford, CA (US); Jun Ye, Palo Alto, CA (US)

(73) Assignee: Brion Technologies, Inc., Santa Clara, CA (US)

( * ) Notice: Subject to any disclaimer, the term of this patent is extended or adjusted under 35 U.S.C. 154(b) by 324 days.

(21) Appl. No.: 10/337,510

(22) Filed: Jan. 7, 2003

(65) Prior Publication Data

US 2003/0128870 A1 Jul. 10, 2003

Related U.S. Application Data

(60) Provisional application No. 60/347,169, filed on Jan. 8, 2002.

(51) Int. Cl.[7] .............................................. H01L 27/00
(52) U.S. Cl. .................................... 250/208.1; 250/311
(58) Field of Search ......................... 250/208.1, 201.3, 250/548, 559.3, 492.24, 311, 306; 382/144, 145

(56) References Cited

U.S. PATENT DOCUMENTS

| | | |
|---|---|---|
| 4,585,342 A | 4/1986 | Lin et al. |
| 4,701,606 A | 10/1987 | Tanimoto et al. |
| 4,929,083 A | 5/1990 | Brunner |
| 5,202,748 A | 4/1993 | MacDonald et al. |
| 5,235,400 A | 8/1993 | Terasawa et al. |
| 5,316,896 A | 5/1994 | Fukuda et al. |
| 5,481,624 A | 1/1996 | Kamon |
| 5,491,724 A | 2/1996 | Altes |
| 5,597,868 A | 1/1997 | Kunz |
| 5,629,772 A | 5/1997 | Ausschnitt |
| 5,631,731 A | 5/1997 | Sogard |
| 5,638,211 A | 6/1997 | Shiraishi |
| 5,700,601 A | 12/1997 | Hasegawa et al. |

(Continued)

FOREIGN PATENT DOCUMENTS

| | | |
|---|---|---|
| EP | 0 628 806 | 4/1994 |
| WO | WO 00/59206 | 10/2000 |

OTHER PUBLICATIONS

"A New Mask Evaluation Tool, the Microlithography Simulation Microscope Aerial Image Measurement System", Budd, et al., SPIE vol. 2197, 1994, pp. 530–540.

"Characterization of Lithographic System Performance Through Direct Aerial Image Measurements", C.H. Fields, SRC/SEMATECH, 1996 (96–MC–500).

(Continued)

*Primary Examiner*—Que T. Le
(74) *Attorney, Agent, or Firm*—Neil A. Steinberg

(57) ABSTRACT

A system to sense an aerial image produced by optical equipment used in, for example, semiconductor fabrication. In one embodiment, the system includes a photo-electron emission device which, in response to an aerial image projected thereon, emits electrons in a pattern corresponding to the light intensity distribution produced by the aerial image. Electron optics provides an enlarged pattern of the pattern in which the electrons are emitted. A sensing unit senses the enlarged pattern. In another embodiment, the system employs a photo-conducting layer to project the aerial image thereon. The photo-conducting layer, in response to the projection of the aerial image thereon, produces local charge depletion corresponding to the light intensity distribution. A steering device delivers electrons to the photo-conducting layer to produce local re-charging currents in proportion to the local charge depletion. A pattern corresponding to the aerial image may be obtained from the re-charging currents.

27 Claims, 8 Drawing Sheets

U.S. PATENT DOCUMENTS

| | | |
|---|---|---|
| 5,795,688 A | 8/1998 | Burdorf et al. |
| 5,828,455 A | 10/1998 | Smith et al. |
| 5,866,935 A | 2/1999 | Sogard |
| 5,888,675 A | 3/1999 | Moore et al. |
| 5,891,959 A | 4/1999 | Kunz |
| 5,898,479 A | 4/1999 | Hubbard et al. |
| 5,914,774 A | 6/1999 | Ota |
| 5,969,639 A | 10/1999 | Lauf et al. |
| 5,973,316 A | 10/1999 | Ebbesen et al. |
| 5,978,085 A | 11/1999 | Smith et al. |
| 6,002,740 A | 12/1999 | Cerrina et al. |
| 6,005,682 A | 12/1999 | Wu et al. |
| RE36,509 E | 1/2000 | Shigihara |
| 6,040,936 A | 3/2000 | Kim et al. |
| 6,052,238 A | 4/2000 | Ebbesen et al. |
| 6,236,033 B1 | 5/2001 | Ebbesen et al. |
| 6,240,219 B1 | 5/2001 | Gregory |
| 6,268,093 B1 | 7/2001 | Kenan et al. |
| 6,278,101 B1 | 8/2001 | Puyot |
| 6,285,020 B1 | 9/2001 | Kim et al. |
| 6,329,112 B1 | 12/2001 | Fukuda et al. |
| 6,335,220 B1 | 1/2002 | Shioyama et al. |
| 6,356,345 B1 | 3/2002 | McArthur et al. |
| 6,360,012 B1 | 3/2002 | Kreuzer |
| 6,362,907 B1 | 3/2002 | Stone et al. |
| 6,368,763 B2 | 4/2002 | Dirksen et al. |
| 6,451,490 B1 | 9/2002 | Advocate et al. |
| 6,459,823 B2 | 10/2002 | Altunbasak et al. |
| 6,515,272 B1 | 2/2003 | Fontaine et al. |
| 6,525,328 B1 * | 2/2003 | Miyoshi et al. ........ 250/492.22 |
| 6,534,798 B1 | 3/2003 | Scherer et al. |
| 2001/0055415 A1 | 12/2001 | Nozaki |
| 2002/0003216 A1 | 1/2002 | Kida et al. |
| 2002/0005947 A1 | 1/2002 | Goldberg et al. |
| 2002/0036775 A1 | 3/2002 | Wolleschensky et al. |
| 2002/0041377 A1 | 4/2002 | Hagiwara et al. |
| 2002/0062206 A1 | 5/2002 | Liebchen |
| 2002/0067478 A1 | 6/2002 | Karpol et al. |
| 2002/0070355 A1 | 6/2002 | Ota |
| 2002/0105629 A1 | 8/2002 | Sandstrom et al. |
| 2002/0122187 A1 | 9/2002 | Bruce et al. |
| 2002/0134912 A1 | 9/2002 | Veneklasen et al. |
| 2002/0145717 A1 | 10/2002 | Baselmans et al. |
| 2002/0167651 A1 | 11/2002 | Boonman et al. |
| 2002/0172876 A1 | 11/2002 | Baselmans |
| 2002/0192598 A1 | 12/2002 | Hirayanagi |
| 2003/0001107 A1 | 1/2003 | Kroon et al. |
| 2003/0017805 A1 | 1/2003 | Yeung et al. |
| 2003/0027057 A1 | 2/2003 | Schroeder et al. |
| 2003/0027366 A1 | 2/2003 | Dulman et al. |
| 2003/0042433 A1 | 3/2003 | Kamijo |
| 2003/0047694 A1 | 3/2003 | Van Der Laan |

OTHER PUBLICATIONS

"Aerial Image Measurements on a Commercial Stepper", Fields, et al., SPIE vol. 2197, 1994, pp. 585–595.

"A Novel High–Resolution Large–Field Scan–and–Repeat Projection Lithography System", K. Jain, SPIE vol. 1463 Optical/Laser Microlithography IV, 1991, pp. 666–677.

"Direct Aerial Image Measurements to Evaluate the Performance of an Extreme Ultraviolet Projection Lithography System", Fields, et al., J. Vac. Sci. Technol. B, vol. 14, No. 6, Microelectronics and Nanometer Structures, Nov./Dec. 1996, pp. 4000–4003.

"Direct Aerial Image Measurement as a Method of Testing High Numerical Aperture Microlithographic Lenses", Partio et al., J. Vac. Sci. Technol. B, vol. 11, No. 6, Nov. Dec. 1993, pp. 2686–2691.

"Initial Experiments on Direct Aerial Image Measurements in the Extreme Ultraviolet", Fields et al., Proc. OSA Trends in Optics and Photonics, Extreme Ultraviolet Lithography, Boston, MA, 1996.

"A Transmission X–Ray Microscope Based on Secondary–Electron Imaging", Watts et al., Rev. Sci. Instrum., vol. 68, No. 9, Sep. 1997, pp. 3464–3476.

"Scanning Probe Lithography Using a Cantilever with Integrated Transistor for On–Chip Control of the Exposing Current", Wilder and Quate, Journal of Vacuum Science and Technology B, vol. 17, No. 6, Nov./Dec. 1999, pp. 3256–3261.

The Nanodetector: An Extreme Ultraviolet Conversion Microscope, 2 pages, Online: May 1998.

PEEM Product Literature, Staib Instruments, Nov. 5, 2001, 8 pages.

Omicron Product Literature, Focus, Date unknown, 12 pages.

"Race to Build Third Generation Photoemission Electron Microscope", Science Beat, Berkeley Lab, Jul. 5, 2001, 4 pages.

"Imagerie en photoemission de haute resolution spatiale (PEEM)", Vogel et al., Mar. 28, 2001, 3 pages.

"A Multi–Blanker for Parallel Electron Beam Lithography", G. Winograd, Ph.D. Dissertation, Stanford University, May, 2000.

"Ultra–low Energy Electron Optics for Lithography and Microscopy", L. Hordon, Ph.D. Dissertation, Stanford University, Jun. 1994.

"Extraordinary optical transmission through sub–wavelength hole arrays", Ebbesen et al., Nature, vol. 391, Feb. 1998, pp., 1994, pp. 667669.

"Control of Optical Transmission Through Metals Perforated with Subwavelength Hole Arrays", Kim et al., Optics Letters, vol. 24, No. 4, Feb. 1999, pp. 256–258.

"Image Monitor for Markle–Dyson Optics", Grenville et al., Journal of Vacuum Science Technology B, vol. 6, No. 11, Nov./Dec. 1993, pp. 2700–2704.

"A General Simulator for VLSI Lithography and Etching Processes: Part I–Application to Projection Lithography", Oldham et al., IEEE Transactions on Electron Devices, vol. ED–26, No. 4, Apr. 1979, pp. 717–722.

"High–Resolution Lithography with Projection Printing", H. Moritz, IEEE Transactions on Electron Devices, vol. ED–26, No. 4, Apr. 1979, pp. 705–710.

"Contrast Studies in High–Performance Projection Optics", Oldham et al., IEEE Transactions on Electron Devices, vol. ED–30, No. 11, Nov. 1983, pp. 1474–1479.

"High Resolution, Low–Voltage Probes from a Field Emission Source Close to the Target Plane", McCord and Pease, Journal of Vacuum Science Technology B, vol. 1, No. 3, Jan./Feb. 1985, pp. 198–201.

"Near–Field Optics: Microscopy, Spectroscopy, and Surface Modification Beyond the Diffraction Limit", Betzig and Trautman, Science, vol. 257, Jul. 1992, pp. 189–195.

"Direct Aerial Image Measurement as a Method of Testing High Numerical Aperture Microlithographic Lenses", Partio et al., Journal of Vacuum Science Technology B, vol. 6, No. 11, Nov./Dec. 1993, pp. 2686–2691.

"Moire Technique for Overlay Metrology", Brunner and Smith, SPIE Integrated Circuit Metrology II, vol. 480, 1984, pp. 164–170.

"In Situ Resolution and Overlay Measurement on a Stepper", Brunner and Allen, SPIE Micron and Submicron Intergrated Circuit Metrology, vol. 565, 1985, pp. 6–13.

"Growth of Low–Defect Density In 0.25Ga0.75As on GaAs by Molecular Beam Epitaxy", Pickrell et al., Journal of Vacuum Science Technology B, vol. 6, No. 18, Nov./Dec. 2000, pp. 2611–2614.

"Super–Resolved Surface Reconstruction From Multiple Images", Cheeseman et al., Technical Report FIA–94–12, NASA Ames Research Center, Dec. 1994.

"Monolithic Detector Array Comprised of >1000 Aerial Image Sensing Elements", Kunz et al., To be published in the SPIE Proceeding of the Microlithography, 2003.

"In Situ Meaurement of an Image During Lithographic Exposure", Brunner et al., IEEE Electron Device Letters, vol. EDL–6, No. 7, Jul. 1985, pp. 329–331.

"Improving Photomask Linewidth Measurement Accuracy via Emulated Stepper Aerial Image Measurement", J. Potzick, SPIE vol. 2322, Photomask Technology and Management, 1994, pp. 353–359.

"Pattern Shape Analysis Tool for Quantitative Estimate of Photomask and Process", Yonekura, et al., Proceedings of Spie vol. 4409, Photomask and Next–Generation Lithography Mask Technology VIII, 2001, pp. 204–211.

"Meeting the Challenge of Advanced Lithography Reticle Inspection", Zurbrick et al., SPIE vol. 2322, Photomask Technology and Management, 1994, pp. 7–15.

"In Situ Resolution and Overlay Measurement on a Stepper", Brunner et al., SPIE vol. 565, Micron and Submicron Integrated Circuit Metrology, 1985, pp. 6–13.

"Application of the Aerial Image Measurement System (AIMS™) to the Analysis of Binary Mask Imaging and Resolution Enhancement Techniques", Martino et al., SPIE vol. 2197, 1994, pp. 573–584.

"Optical Limitations to Cell Size Reduction in IT–CCD Image Sensors", Satoh et al., IEEE, IEDM–95, 1995, pp. 159–162.

"Direct Aerial Image Monitoring for Extreme Ultraviolet Lithography Systems", C.H. Fields, Ph.D. Dissertation Thesis, University of California, Berkeley, Spring 1997.

* cited by examiner

SYSTEM AND METHOD FOR AERIAL IMAGE SENSING

CROSS-REFERENCE TO RELATED APPLICATIONS

This application claims priority to U.S. Provisional Application Ser. No. 60/347,169, entitled "Aerial Image Sensing", filed Jan. 8, 2002. The contents of this provisional patent application are incorporated by reference herein in their entirety.

FIELD OF THE INVENTION

The present invention relates generally to sensing an aerial image and more particularly to systems and techniques for increasing the sensing resolution of an aerial image.

BACKGROUND

Aerial imaging typically employs an optical imaging and projection system to project a two-dimensional aerial image onto an image plane. The location of the image plane is defined by the optics of the imaging and projection system. The same optics also limits the imaging performance by introducing diffraction, aberration and other effects. A straightforward method of sensing the aerial image is to place a conventional image sensor (for example, a conventional CCD) at the aerial image plane. In this method, the resolution of the sensed image is limited by the sensor pixel size. Conventional CCDs generally have a resolution in the order of 2 to 20 micrometers.

In certain applications, the quality of the aerial image is very high. For example, in the field of photolithography, the aerial image is an image of a reticle or mask produced with a photolithographic device such as a "stepper" or a "scanner". The stepper and scanner employ different stepping/scanning procedures while imaging the mask to produce a mask pattern in the image plane where a wafer to be patterned is located. Because the mask pattern contains some very small features (for example, with minimum feature size in the order of one tenth of a micron in VLSI (Very Large Scale Integrated circuit) technology), the aerial image sensing requires a very high resolution, for example, in the order of 50 nm.

Certain prior art describes various techniques for improving the monitoring and adjusting the imaging performance of the imaging systems. For example, A. Grenville, et al., "Image Monitor for Markle-Dyson Optics", Journal of Vacuum Science and Technology B, No. 11, Vol. 6, November/December 1993, pp. 2700–2704 describe a scanned grating technique for quantifying the imaging properties of optical imaging and projection systems producing aerial images.

Nakagiri et al., U.S. Pat. No. 5,464,977 ("Nakagiri") describes an optical detection apparatus and method for measuring, at a high resolution, an image in the wavelength range from the infrared to the gamma ray. Nakagiri uses a photoelectric conversion medium to produce a change in an electric property within a photoelectric conversion medium according to incident image light. A probe placed in contact with the medium scans the medium to measure the change in the electric property to derive distribution information corresponding to the image.

Examining masks for lithography in high-energy ranges of the electromagnetic spectrum, such as the X-ray range, presents additional challenges because of, for example, the severe limitations on imaging and lack of suitable transmission optics. In U.S. Pat. No. 6,002,740, Cerrina and Lucatorto propose a method and apparatus for inspecting X-ray and extreme ultraviolet (EUV) masks and other objects. This method employs a converter to convert the image produced by X-rays or EUV light incident thereon to an image formed by electrons emitted from the converter. The emitted electrons are magnified in an electron microscope by as much as 100 to 1,000 times and the magnified electron image is displayed by the electron microscope. The resolution obtained in the Cerrina and Lucatorto system corresponds to the resolution of the photoemission electron microscope and is in the range of 20 nm to 200 nm depending on the energy range of the emitted photo-electrons.

There is a need for system and technique that provides enhanced sensing resolution of an aerial image produced by conventional transmission optics of, for example, photolithography steppers or scanners. There is a need for an improved system and technique that enables sensing an aerial image produced by visible or ultraviolet optics at a resolution of, for example, 50 nm.

Moreover, there is a need for an apparatus and a method for aerial image sensing at enhanced resolution that may be employed for mask inspection, preferably in-situ, in a conventional photolithographic stepper or scanner. In this application, the sensing resolution is significantly smaller than the minimum feature size in the pattern to be printed on the wafer. Further, there is a need for an apparatus and a method that facilitates calibration, tuning and monitoring of the conventional photolithographic stepper or scanner using the sensed aerial image.

SUMMARY OF THE INVENTION

In one aspect, the present invention is a method and an apparatus for sensing an aerial image at a much higher resolution relative to conventional image sensing devices, systems and techniques. In one embodiment, the system includes a negative electron affinity photo-electron emission device for projecting the aerial image thereon. The photo-electron emission device emits electrons with a very tight energy spread (in the range 40 to 400 meV) in a pattern corresponding to the light intensity distribution produced by the aerial image. The system includes electron optics to guide and project the electrons and thereby form an enlarged pattern of the "original" pattern in which the electrons were emitted. A sensing unit senses the enlarged pattern and supplies it to a device for capturing and digitizing the enlarged pattern to obtain therefrom a digitized aerial image. The resolution increase is achieved through the enlargement of the pattern.

The system of this embodiment may further include a light source and condensing optics for illuminating an object whose aerial image is to be generated. An optical imaging and projection system captures light from the illuminated object and images it to produce the aerial image.

In a preferred embodiment, the system and technique are used in a photolithographic stepper or a photolithographic scanner. In the integrated circuit manufacturing environment, a stepper or scanner projects the aerial image on a semiconductor wafer to pattern the wafer using the light from the light source. The illuminated object in this embodiment is a photolithographic mask. The system may be integrated with the stepper or scanner in such a way that it can be interchangeably positioned with the wafer at the aerial imaging plane.

In certain instances, it may be advantageous to provide the apparatus with a feedback unit for feeding back at least a portion of the digitized aerial image (for example, a portion containing alignment marks) to the stepper or scanner. In accordance with one aspect of the method of the present invention, the stepper or scanner may use this information for calibrating, tuning, initialization or set-up.

Since, in certain embodiments, the enlarged pattern is an enlarged circuit pattern corresponding to the photolithographic mask by exposure light at an exposure wavelength that will otherwise be used to expose the wafer, an in-situ inspection of the mask pattern can be performed. "In-situ" here refers to the fact that the aerial image used to inspect the mask is the same (or substantially the same) as otherwise used for wafer exposure.

In one embodiment, the photo-electron emission device may include an electron-multiplying cathode to amplify the emitted electrons and to isolate the vacuum surrounding the negative electron affinity photocathode from that elsewhere in the system. Indeed, it may be advantageous to employ an electron-multiplying cathode having a dimension such that the emitted electrons impacting on the electron-multiplying cathode cause emission of substantially thermalized electrons. In this way, the thermalized electrons may have a tight energy spread that, in certain instances, may be advantageous for measurement issues.

In one embodiment the photo-electron emission device and the electron optics constitute a Photo-Electron Emission Microscope (PEEM). The resolution of the PEEM may be selected to be much higher than the resolution of a conventional image sensor, for example, a conventional CCD.

In yet another embodiment of the present invention, the apparatus employs a photo-conducting layer for projecting the aerial image thereon. The photo-conducting layer is made of a suitable semiconducting material to render it locally conducting in correspondence to the light intensity distribution of the aerial image. Thus, the projection of the aerial image on the photo-conducting layer produces local charge depletion in the photo-conducting layer according to a depletion pattern, which corresponds to the light intensity distribution.

In this embodiment of the present invention, the apparatus may also include an electron source for providing electrons and a device for delivering the electrons to the photo-conducting layer to produce local re-charging currents in proportion to the local charge depletion. The apparatus may also include electronics to derive a pattern corresponding to the aerial image from the re-charging currents.

Further, in certain embodiments, the apparatus includes a device for capturing and digitizing the pattern to obtain the digitized aerial image. In this regard, the apparatus comprises a micro-vidicon in which the electron source is a beam source delivering a beam of electrons, and the device for delivering the electrons to the photo-conducting layer is an electron beam scanner.

In one embodiment, the re-charging electron source is provided by an array of scanning micro-tips. The tips may be similar to those used in a conventional atomic force microscope (AFM). This approach provides much higher throughput due to the parallel operation of the array of tips. In addition, this approach may allow very compact sensor to be built due to the short distance between the tips and the photo-conducting layer.

In yet another aspect, the present invention is a sensor, system and/or technique that employs an array of photo-detectors (for example, a conventional CCD), wherein each photo-detector is sensitive over a small, restricted area (relative to the sensing areas of the photo-detectors in a conventional CCD). In one embodiment of this aspect of the present invention, the sensing area of the photo-detectors are limited or restricted by covering certain portions of the sensing area of the detectors in a conventional CCD with a film of, for example, metal (for example, platinum). In this regard, a plurality of fine apertures in the film (one aperture per photo-detector) may be selectively milled so as to limit the photo-sensitive area of each photo-detector. The limited photo-sensitive area of the photo-detector generally corresponds to the resolution of the detector.

In another embodiment of this aspect of the invention, a photo-detector enhancement material (for example, a photo-sensitive semiconductor material) may be grown or deposited within the aperture. In this way, the photo-reception efficiency of the photo-sensitive area of each photo-detector under the aperture may be enhanced.

In operation, the array of photo-detectors may be scanned across the image plane to collect image data and thereby "build-up" the aerial image.

It should be noted that the restricted area may be larger than the required resolution but sufficiently well controlled that subsequent image processing could be used to bring about the required resolution. Such image processing may involve deconvolution or other image processing techniques.

Yet another technique to construct the sparse photo detector array, each with a small restricted photo-sensitive area, is to employ fiber-based, near-field scanning optical microscopy techniques in which high resolution is achieved using a tapered fiber.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, materials and/or elements in different figures are labeled similarly. Various combinations of the structures, components, materials and/or elements, other than those specifically shown, are contemplated and are within the scope of the present invention.

DETAILED DESCRIPTION

Figure 1:
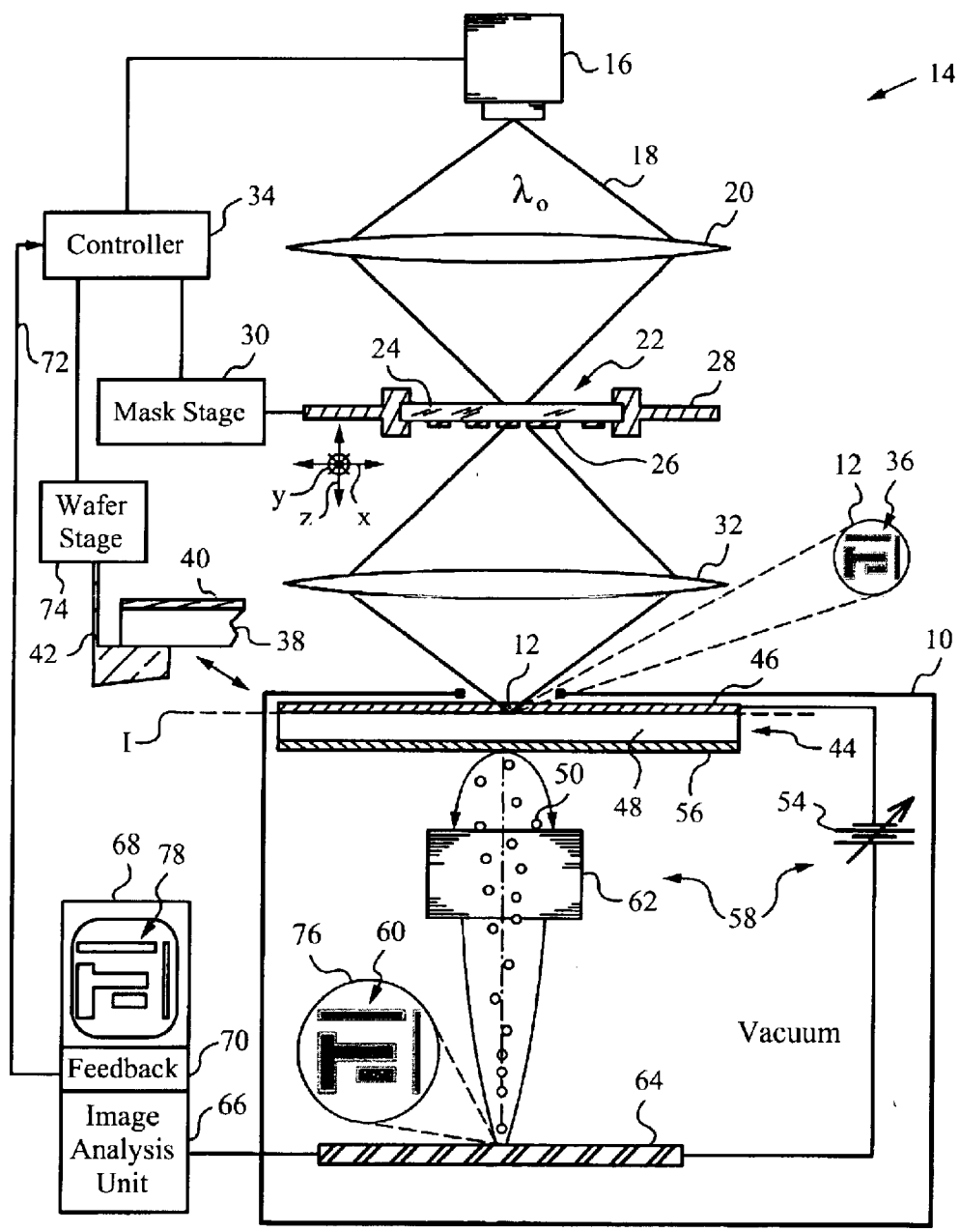
FIG. 1 is a block diagram of an embodiment for aerial image sensing in accordance with the invention employed in a photolithographic device.

With reference to FIG. 1, apparatus 10 senses an aerial image 12 in a photolithographic device 14. Photolithographic device 14 is equipped with a light source 16 for generating light 18 at a suitable exposure wavelength $\lambda_o$. Photolithographic device 14 may be integrated into or part of a photolithographic stepper or scanner. The light source 16 may be a laser (for example, a pulsed laser), a UV exposure lamp or any other source suitable for photolithography.

The photolithographic device 14 also includes condensing optics 20, in the form of a refractive lens, to collect light 18 emitted by source 16 and focus it on an object 22. It should be noted that any type of optics may be used to collect light 18 including, for example, reflective optics rather than refractive optics.

The object 22 may be a photolithographic mask made of a substrate 24 and a mask pattern 26 deposited on the surface of substrate 24. In the present embodiment, substrate 24 is transmissive to light 18 at exposure wavelength $\lambda_o$ but it will be appreciated that photolithographic masks and devices operating in the reflecting mode can also be used.

Mask 22 is mounted on a mask handler 28 connected to a mask stage 30. The mask stage 30 is designed to move handler 28 along the x- and y-axes, as indicated by the arrows in the plane of the page and pointing in and out of the page, to correspondingly displace mask 22. A z-axis adjustment can also be provided in handler 28, as necessary. The mask stage 30 is controlled by a controller 34, which is also connected to light source 16 to coordinate the operation of source 16 and stage 30. Alternatively, when using a photolithographic stepper or scanner, controller 34 can move entire apparatus 10 to realize the x-, y-, and z-axis motion, and stepping or scanning functions.

An optical imaging and projection system 32 is positioned to capture light 18 transmitted through image mask 22 (and mask pattern 26) to produce aerial image 12 in an image plane I. In the illustrated embodiment, optical imaging and projection system 32 consists of a refractive imaging lens, however, other imaging optics, including reflective optics can be used to produce aerial image 12 of mask pattern 26.

Aerial image 12 exhibits a light intensity distribution 36 at a primary resolution $R_p$. Primary resolution $R_p$ can be defined in any convenient manner (for example, by the highest spatial frequency component in the distribution) or any method well known to those skilled in the art. For good lithography yield, it may be important that mask pattern 26 be free of defects and that photolithographic device 14 and specifically lens 32 create a high quality aerial image 12 of mask 22 at primary resolution $R_p$ in image plane I.

In a preferred embodiment, apparatus 10 is integrated into the photolithographic device 14 in such a way that there is a mechanical positioning unit 42 for (manually or automatically) interchangeably positioning a semiconductor wafer 38 (together with its handling stage) to be patterned and apparatus 10. In one embodiment, mechanical positioning unit 42, in response to an operator input, automatically positions apparatus 10 (and, in particular, photo-electron emission device 44) in image plane I. The semiconductor wafer 38 (together with its handling stage) may be relocated to facilitate positioning of apparatus 10 in image plane I.

In another embodiment, mechanical positioning unit 42 permits an operator to manually position apparatus 10 in plane I. The semiconductor wafer 38 (together with its handling stage) may be relocated, manually or automatically, to permit proper placement of apparatus 10.

In one embodiment, the apparatus 10 includes a photo-electron emission device 44. The photo-electron emission device 44 is essentially a photocathode (having, for example, a combination of AlGaAs/GaAs/CsO layers). Briefly, in one embodiment, on the underside of photo-electron emission device 44 is a thin (for example, one micron thick) layer of aluminum gallium arsenide (AlGaAs) where a fraction of aluminum varies from about 50% at the top of the layer to zero at the bottom. The bottom surface may be treated with a mixture of cesium and oxygen to further lower the electron affinity and thereby enhance photo-emission.

In particular, the photo-electron emission device 44, in one embodiment, includes support layer 46. The support layer 46 is transparent to light 18 at exposure wavelength $\lambda_o$. The support layer 46, in one embodiment, is fused silica.

The photo-electron emission device 44 further includes photo-electron emission medium 48 for emitting electrons 50 in response to light 18 at exposure wavelength $\lambda_o$. Preferably, photo-electron emission device 44 has a negative electron affinity (NEA) at the surface from which electrons 50 are emitted. Materials exhibiting NEA have a conduction band energy that falls below the vacuum energy at the material surface, thus facilitating the emission of electrons within a very tight energy spread (about 100 meV). Suitable photo-electron emission media include GaAs.

In one embodiment, layer 56, which may be a mixture of cesium (Cs) and oxygen (O) for enhancing surface NEA, facilitates the emission of electrons 50 from the conduction band of medium photo-electron emission 48. It should be noted that other techniques for producing and/or enhancing NEA may be used. Depending on the type of photo-electron emission medium 48 employed, such alternative techniques may include hydrogenation of the surface from which electrons 50 are emitted.

In operation, photo-electron emission device 44 emits electrons 50 in a pattern corresponding to light intensity distribution 36 produced by aerial image 12. The electron optics 58, which in the present embodiment include voltage source 54 and a magnetic unit 62, are provided for guiding and projecting electrons 50 to form an enlarged pattern 60 of the pattern in which electrons 50 are emitted from photo-electron emission device 44. The voltage source 54 is connected between support layer 46 and a sensing unit 64 for applying a potential difference between support layer 46 and sensing unit 64. The potential difference sets up an electric field for drawing electrons 50 from the surface of photo-electron emission device 44 and accelerating them towards sensing unit 64 in accordance with Coulomb's law. At the same time, magnetic unit 62 applies a magnetic field to electrons 50.

It should be noted that any suitable coil magnets or permanent magnets (for example, units analogous to those used as yokes in guiding electron beams in CRT displays) can serve the function of unit 62. The direction of the magnetic field is selected to apply a force to deflect or focus electrons 50 depending on their velocity in accordance with well-known principles in electron optics. Both axial and transverse magnetic fields including fields exhibiting a gradient can be used. The magnetic fields can be further supplemented by additional electric field(s) for guiding electrons 50.

Sensing unit 64 is preferably an array of charge-coupled devices (CCDs) or any other suitable instrument for sensing the impacting electrons 50 and converting them to electrical signals to thus sense enlarged pattern 60. It is preferable that the space between photo-electron emission device 44 and sensing unit 64 be evacuated. In particular, the space between device 44 and sensing unit 64 is preferably held in a vacuum sufficiently low so as to not interfere with the propagation of electrons 50. The vacuum should keep out any contaminants likely to degrade photo-electron emission device 44 and/or sensing unit 64. A vacuum of about $10^{-7}$ torr will be sufficient when a standard photocathode is used by photo-electron emission device 44. In those situations where photo-electron emission medium 48 is a GaAs semiconductor and layer 56 includes a coating of Cs and O, it may be advantageous to employ a higher vacuum (for example, $10^{-9}$ torr or higher) to prevent degradation of layer 56. Such vacuum may be obtained in a sealed tube, as is known in the art.

With continued reference to FIG. 1, sensing unit 64 is connected to image analysis unit 66, which captures and digitizes enlarged pattern 60. Image analysis unit 66 is connected to feedback circuitry 70 as well as display unit 68, which displays an image of the captured and digitized enlarged pattern 60 to a viewer (for example, an operator). A feedback connection 72 is provided between feedback circuitry 70 and controller 34. Image analysis unit 66 may also perform mask inspection tasks (for example, compare the captured image to a database image) as discussed below.

The controller 34 is connected to wafer stage 74, which controls the position of semiconductor wafer 38 or apparatus 10 via mechanical positioning unit 42. In a preferred embodiment, the information from feedback circuitry 70 is used by controller 34 to adjust parts of photolithographic device 14 such as source 16, position of mask 22 and position of wafer 38 in response to relevant parameters (for example, relative positioning and focusing of aerial image 12). The actual adjustments and how they are effectuated will depend on the type of photolithographic device 14. For example, in one embodiment photolithographic device 14 is integrated in a photolithographic scanner. In this embodiment both mask 22 and wafer 38 are being moved (scanned) during exposure by corresponding stages 30, 74. In another embodiment, photolithographic device 14 is integrated in a photolithographic stepper in which both mask 22 and wafer 38 are stationary during exposure. The digitized enlarged pattern 60 will provide information that can be used for appropriate scanning and/or stepping of mask 22 and/or wafer 38 as well as controlling any other aspects of photolithographic device 14 such as the emission and focusing of light 18 and imaging of mask pattern 26. The analysis of enlarged pattern 60 (for example, by comparison with a database) will also enable in-situ inspection of mask defects and quality.

During a photolithographic procedure, semiconductor wafer 38 with a layer of resist 40 is positioned such that aerial image 12 is projected onto the surface coated with resist 40. Exposure to light 18 at exposure wavelength $\lambda_0$ in accordance with light intensity distribution 36 of aerial image 12 alters the properties of resist 40 in correspondence to light intensity distribution 36. The actual changes occurring in resist 40 can result from thermal, photo-induced, chemical or any other changes in resist 40 as is known in art.

When photo-electron emission device 44 is positioned to receive aerial image 12, device 44 can be used to inspect mask pattern 26 and calibrate photolithographic device 14. The inspection is performed with light 18 emitted at exposure wavelength $\lambda_0$, which is the same exposure light as used for patterning wafer 38. The exposure wavelength $\lambda_0$ may be, for example, in the visible or ultraviolet (UV) range.

The light 18 passes through mask 22 and images mask pattern 26 with the aid of lens 32 on image plane I. The photo-electron emission device 44 is moved (manually or automatically) and held in place by mechanical positioning unit 42 such that image plane I is coplanar with the surface of photo-electron emission medium 48. In other words, aerial image 12 of mask pattern 26 is projected in the form of light intensity distribution 36 onto the surface of photo-electron emission medium 48. In response, photo-electron emission medium 48 generates electrons 50 in a pattern corresponding to distribution 36.

The electrons 50 are drawn off from photo-electron emission device 44 at the NEA surface and are guided by electron optics 58. In this regard, the electric field created by variable voltage source 54 and the magnetic fields produced by magnetic unit 62 guide electrons 50 to sensing unit 64 in such a manner that enlarged pattern 60 of the electron pattern emitted at the NEA surface is produced by electrons 50 impinging on sensing unit 64. Thus, sensing unit 64 senses an enlarged aerial image 76 of mask pattern 26. Additionally, because of the very short wavelength of electrons 50, enlarged pattern 60 exhibits negligible additional diffraction caused by electron optics 58. The increased resolution is due to enlargement of the electron pattern corresponding to distribution 36. Thus, sensing unit 64 such as a CCD sensor having pixel size $P_{det}$ can effectively sense aerial image 12 at a much smaller pixel size $P_a$, where $P_a = P_{det}/M$, where M is the magnification factor of electron optics 58.

The sensing unit 64 provides information which is representative of the enlarged pattern 60 to image analysis unit 66, which captures and digitizes enlarged pattern 60 to obtain therefrom a digitized aerial image 78 at increased resolution $R_f$. In one embodiment, digitized aerial image 78 is displayed on display unit 68. In addition, feedback circuitry 70 provides information which is representative of mask 22 and mask pattern 26 obtained from digitized aerial image 78 to controller 34. Specifically, feedback circuitry 70 feeds back at least a portion of digitized aerial image 78 (for example, a portion containing image, or fiducial or alignment marks of mask pattern 26) to controller 34. The controller 34 may use this information to control (for example, set, align or re-align) stages 30 and 74, optics 20 and 32, and/or light source 16 (among other things).

The digitized aerial image 78 of enlarged pattern 60 may be used (for example, by an operator) to calibrate, tune or set-up photolithographic device 14. In fact, the information derived from digitized aerial image 78 can be used for many purposes and can even be shared among a number of photolithographic devices. For example, in one embodiment, digitized aerial image 78 is used by a computer (not illustrated) in inspecting defects and quality of a number of masks. The computer may perform die-to-die (D:D) inspection, die-to-database (D:DB) inspection, image self-analysis (SA) techniques, or inspection techniques that are combinations thereof.

In one embodiment, photolithographic device 14 (and apparatus 10) is dedicated to mask inspection using digitized aerial image 78. The mask under inspection may be a product mask or a test mask. In either instance, the inspection determines, among other things, the accuracy of the mask fabrication process and the accuracy of the pattern on the mask resulting from that process.

In yet another embodiment, photolithographic device 14 is interleaved with the task of mask inspection and semiconductor wafer printing. In a preferred embodiment, the information from digitized aerial image 78 is used for in-situ inspection of mask pattern 26, where photolithographic device 14 is integrated in or part of a photolithographic stepper or scanner.

Figure 2:
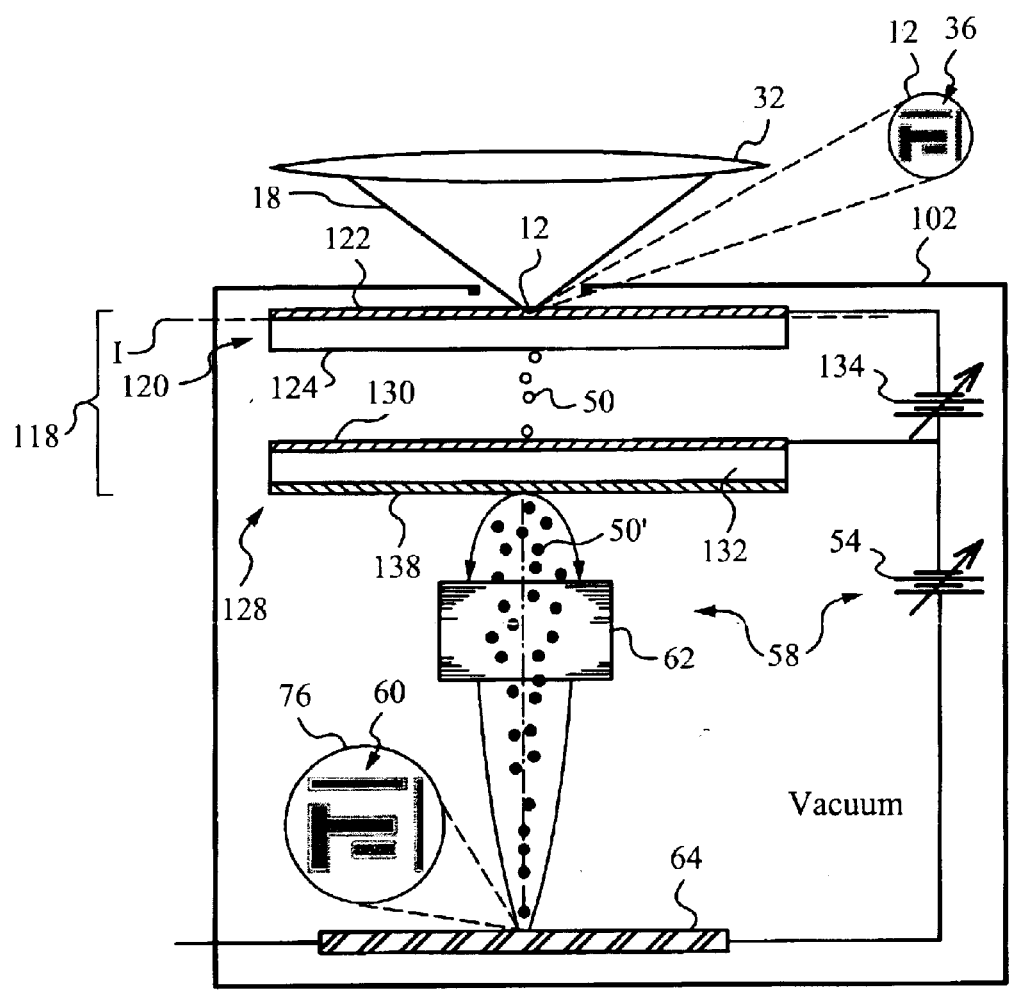
FIG. 2 is a block diagram of another embodiment for aerial image sensing in accordance with the invention employed in the device of FIG. 1.

FIG. 2 illustrates another embodiment for sensing an aerial image 12 in a photolithographic device 14 in accordance with the present invention. In this embodiment, apparatus 102 is a variation of apparatus 10 for enlarging aerial image 12 of object 22. Specifically, apparatus 102 employs photo-electron emission device 118 with photocathode 120 consisting of an electrode layer 122 and a medium 124 for generating electrons 50 in response to light 18. The photo-electron emission device 118 also includes an electron-multiplying cathode 128 for amplifying electrons 50.

In one embodiment, electron-multiplying cathode 128 includes top electrode layer 130, which may be comprised of gallium nitride (GaN) or diamond. The electrode layer 130 is sufficiently thick to prevent electrons 50 from penetrating layer 130, but sufficiently thin to allow the internally generated free electrons to be transported to the bottom (emitting) surface, namely target semiconductor 132, which amplifies electrons 50.

Where electrons 50 are accelerated to 1 KeV, an electrode layer 130 comprised of GaN should be about 100 nm thick and an electrode layer 130 comprised of diamond should be about 200 nm to 300 nm thick. It should be noted that in certain circumstances, it may be advantageous to treat electrode layer 130 with metallic cesium, where layer 130 is comprised of GaN, or with a hydrogen plasma, in the case where layer 130 is comprised of diamond.

To aid in the amplification process, a voltage source 134 is connected between electrode layer 122 and electrode layer 130 to set up an electric field between photocathode 120 and electron-multiplying cathode 128. The electric field is used for accelerating electrons 50 into target semiconductor 132. The surface of target semiconductor 132 from which amplified electrons 50' are emitted is coated with an NEA coating 138.

It should be noted that additional information on the specific design and operation of electron-multiplying cathodes may be found in literature by Hamamatsu at http://usa.hamamatsu.com/cmp-detectors or in the book "Television", V. K. Zworykin and G. A. Morton (Wiley, 1954), the contents of which are hereby incorporated by reference.

The apparatus 102 is otherwise equipped similarly to apparatus 10 with electron optics 58 including voltage source 54 and magnetic unit 62 for guiding amplified electrons 50' to sensing unit 64. During operation aerial image 12 of object 22 is projected into image plane I or onto photocathode 120 of photo-electron emission device 118 and light intensity distribution 36 causes electrons 50 to be emitted from semiconductor 124 of photocathode 120 in a pattern corresponding to distribution 36. The electric field set up by voltage source 134 between electrode layers 122 and 130 accelerates electrons 50 in the emitted pattern into electron-multiplying cathode 128. In turn, electron-multiplying cathode 128 emits amplified electrons 50' in the same pattern as the pattern of electrons 50.

Electron optics apply electric and magnetic fields to amplified electrons 50' to guide them such that enlarged aerial image 76 of enlarged pattern 60 of the electron pattern originally emitted from photocathode 120 is projected onto sensing unit 64. In order to take advantage of improved resolution capabilities of apparatus 102, the resolution $R_f$ is selected to be higher than primary resolution $R_p$ of optical imaging and projection system 32, which produces aerial image 12. Thus, increased resolution $R_f$ of enlarged electron pattern 60 is obtained in enlarged aerial image 76 as compared to primary resolution $R_p$ in aerial image 12.

It should be noted that the embodiment of FIG. 2 may also include a computer to implement, among other things, inspection algorithms (for example, die-to-die (D:D) inspection, die-to-database (D:DB) inspection, image self-analysis (SA) techniques, or inspection techniques that are combinations thereof using the digitized aerial image 78. The apparatus 102 may also image analysis unit, including a display to allow an operator, for example, to view the aerial image. In addition, the embodiment of FIG. 2 may include feedback circuitry and a controller, as illustrated in FIG. 1, and described relative thereto. As mentioned above, the controller may use this information to control (for example, set, align or re-align) stages 30 and 74, optics 20 and 32, and/or light source 16.

Moreover, in a preferred embodiment, apparatus 102, like apparatus 10 of FIG. 1, is integrated into photolithographic device 14 in such a way that there is a mechanical positioning unit for (manually or automatically) interchangeably positioning a semiconductor wafer 38 (together with its handling stage) to be patterned and apparatus 102. In one embodiment, the mechanical positioning unit (not illustrated in FIG. 2), in response to an operator input, automatically positions apparatus 102 in image plane I. The semiconductor wafer 38 may be relocated to facilitate positioning of apparatus 10 in image plane I. In another embodiment, like in the embodiment of FIG. 1, the mechanical positioning unit permits an operator to manually position apparatus 102 in plane I. The semiconductor wafer 38 (together with its handling stage) may be relocated, manually or automatically, to permit proper placement of apparatus 102.

Figure 3A:
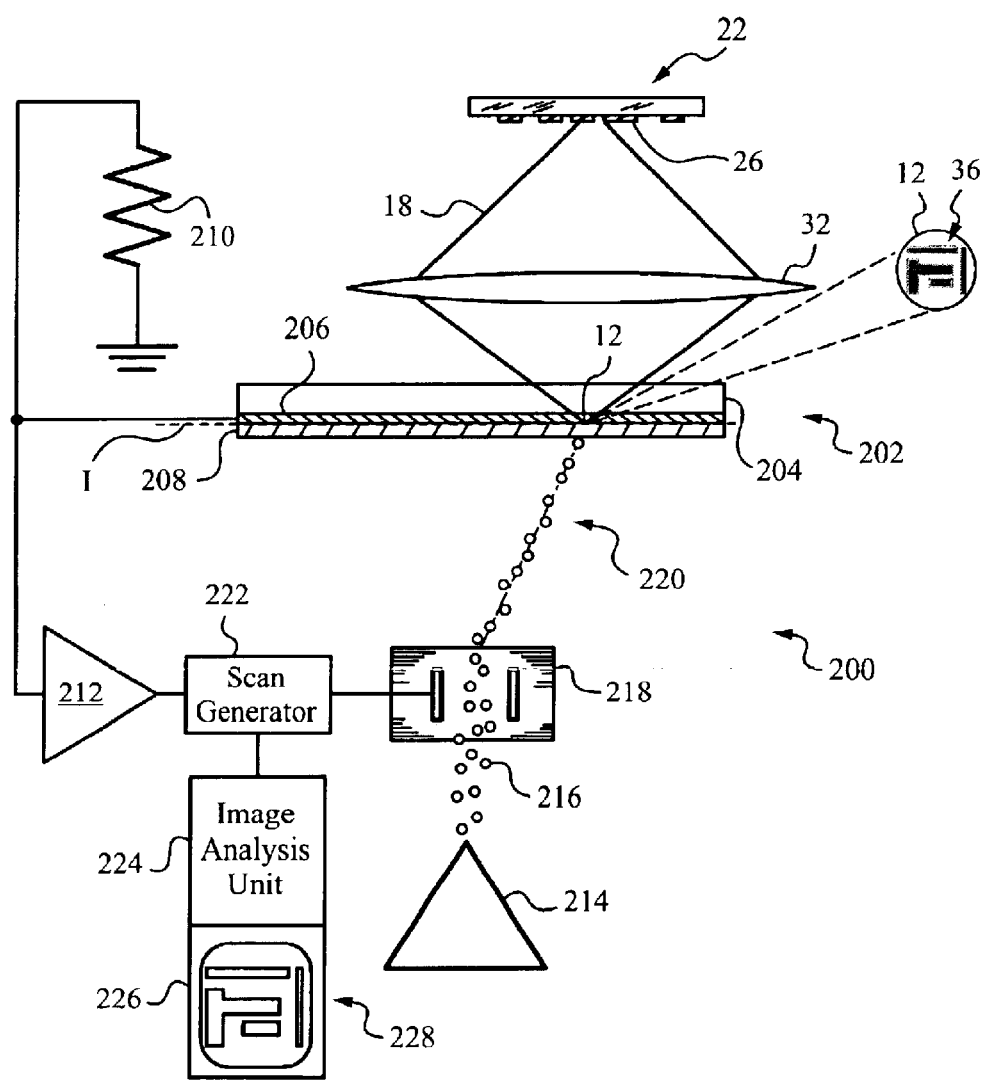
FIG. 3A is a block diagram of an apparatus for aerial image sensing employing a micro-vidicon.

FIG. 3A illustrates another embodiment for sensing an aerial image 12 in a photolithographic device 14 in accordance with the present invention. The apparatus 200 includes a photo-electron conversion unit 202 made of a transparent insulating substrate 204, a transparent conducting layer 206 and a photo-conducting layer 208. The transparent insulating substrate 204, as well as transparent conducting layer 206 which is deposited on substrate 204, are selected from among materials that are transparent to light 18.

The photo-electron conversion unit 202 is positioned such that image plane I defined by lens 32 is coplanar or in the same plane as photo-conducting layer 208. The photo-conducting layer 208 is made of a suitable photosensitive semiconducting material. The semiconducting material may be selected on the basis that light 18 renders the material locally conducting in correspondence to its local intensity. Specifically, the semiconducting material is selected such that light intensity distribution 36 of aerial image 12 imaged and projected on photo-conducting layer 208 by lens 32 renders photo-conducting layer 208 locally conducting in correspondence to light intensity distribution 36.

The apparatus 200 may also include an electron source 214 for supplying electrons 216. The electron source 214 may be a thermionic source, a photocathode or any other device to provide a source of electrons. In certain instances, it may be important to maintain electron source 214 at a certain re-charging potential.

The apparatus 200 may also include steering device 218 for delivering electrons 216 to photo-conducting layer 208.

The steering device 218 may be a yoke system capable of applying suitable electric and magnetic fields to guide electrons 216 to photo-conducting layer 208. More specifically, steering device 218 is capable of combining electrons 216 to form an electron beam 220 and scanning beam 220 across photo-conducting layer 208.

The transparent conducting layer 206 of photo-electron conversion unit 202 is electrically connected to ground via resistor 210 and to amplifier circuitry 212. The amplifier circuitry 212 is designed to sense and amplify currents delivered from conducting layer 206. The resistor 210 is selected to have a sufficiently high resistance value to maintain conducting layer 206 at an appropriate potential. Specifically, the potential of conducting layer 206 is coordinated with the re-charging potential at which electron source 214 is maintained. This is done such that no local current flows through photo-conducting layer 208 to conducting layer 206 and amplifier circuitry 212 when the area of photo-conducting layer 208 being scanned by electrons 216 of electron beam 220 is not depleted of charge.

The amplifier circuitry 212 is further connected to scan generator 222. The scan generator 222 is also connected to steering device 218 and to image analysis unit 224.

The image analysis unit 224 may include display 226 to allow an operator, for example, to view the aerial image. In addition, mechanical positioning unit 42, controller 34 and feedback circuitry 70, as illustrated in FIG. 1, and described relative thereto, may be implement in the embodiment illustrated in FIG. 3A. For the sake of brevity, that discussion will not be repeated.

During operation, aerial image 12 projected and imaged in image plane I by lens 32 produces light intensity distribution 36 on photo-conducting layer 208. In response, photo-conducting layer 208 experiences local charge depletion according to a depletion pattern, which corresponds to light intensity distribution 36. In other words, charge leaves photo-conducting layer 208 at locations that are illuminated by light 18 corresponding to the intensity of light 18 at those locations. Specifically, in operation, charge from the depleted areas flows through transparent conducting layer 206, via resistor 210, to ground.

Scan generator 222 controls steering device 218 and induces it to scan photo-conducting layer 208 with electron beam 220 according to any suitable scanning pattern (for example, a line scan pattern). When electrons 216 are thus delivered to photo-conducting layer 208 in beam 220 they produce local re-charging currents in proportion to the local charge depletion. The re-charging currents are sensed and amplified by amplifier circuitry 212.

The amplified re-charging currents are delivered to image analysis unit 224, which is informed of the scanning pattern by scan generator 222. Based on the scanning pattern and the magnitude of the re-charging currents unit 224 derives the pattern corresponding to light intensity distribution 36 of aerial image 12. In addition, unit 224 captures and digitizes the pattern to obtain a digitized aerial image 228 of aerial image 12. Digitized aerial image 228 exhibits an increased resolution $R_f$. For the operator's convenience, digitized aerial image 228 is displayed on display unit 226. In fact, apparatus 200 is a micro-vidicon in which scan generator 222 and steering device 218 constitute the electron beam scanner and amplifier circuitry 212, scan generator 222 and unit 224 form the electronics for deriving the pattern corresponding to aerial image 12 from re-charging currents. The micro-vidicon 200 operates in accordance with well-known principles. Additional information on micro-vidicons, and the operation thereof, may be found in "Television", V. K. Zworykin and G. A. Morton (Wiley, 1954), for example on page 257.

Figure 3B:
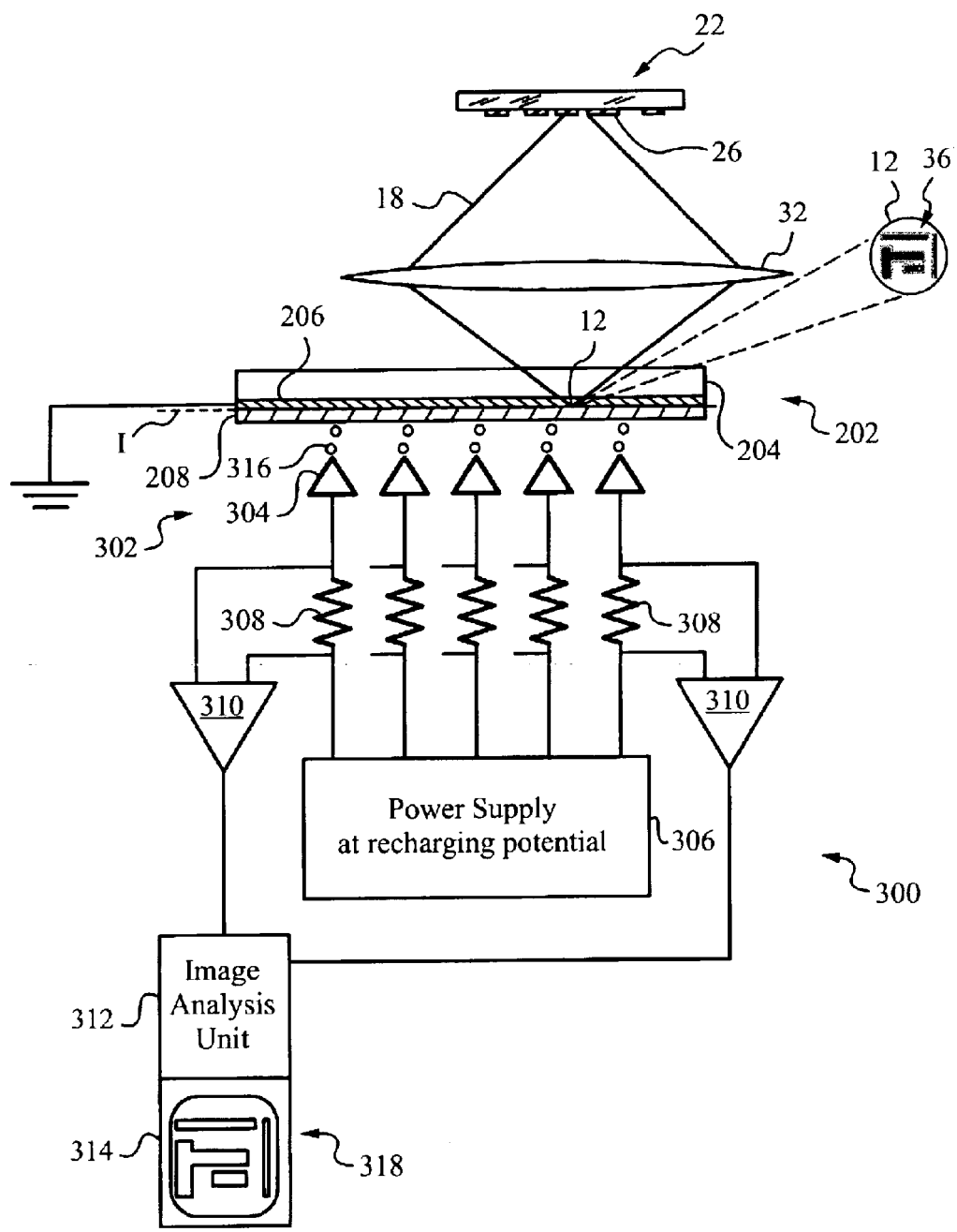
FIG. 3B is a block diagram of yet another embodiment for aerial image sensing in accordance with the present invention.

FIG. 3B illustrates another embodiment for sensing an aerial image 12 in a photolithographic device 14 in accordance with the present invention. The apparatus 300 includes a photo-electron conversion unit 202 (as described above) and electron source 302. The electron source 302 consists of a number of scanning tips 304 that are maintained at re-charging potential by a power supply 306. The scanning tips 304 are preferably carried on a suitable substrate or on cantilevers suitable for scanning the surface of photo-conducting layer 208.

Each scanning tip 304 includes a series resistor 308 and an associated amplifier 310 connected across series resistor 308. FIG. 3B illustrates only two of the plurality of associated amplifiers 310. The output of each amplifier 310 is connected to an image analysis unit 312, which is connected to a display 314.

As in the embodiment of FIG. 3A, aerial image 12 produces light intensity pattern 36. The aerial image 12 is projected on photo-conducting layer 208 to cause local charge depletion. The scanning of tips 304 over photo-conducting layer 208 supply electrons 316 which cause re-charging currents to flow to depleted regions of photo-conducting layer 208. In this case, re-charging currents flow from all tips 304 as they are scanned across photo-conducting layer 208, thus accelerating the re-charging process, allowing for faster operation of apparatus 300 in comparison with apparatus 200. Furthermore, the elimination of electron-optics 214 and 218 (in FIG. 3A) allows much reduced distance between tips 304 (providing re-charging electrons) and photo-conducting layer 208, and hence makes it possible to make very compact sensor module of apparatus 300. The thickness of such sensor module can be reduced to similar thickness as that of a semiconductor wafer, and hence make it much easier to interchangeably position the sensor module with a wafer in lithography device 14.

The amplifiers 310 sense the re-charging currents by the voltage drop across resistors 308. Image analysis unit 312 reconstructs the light intensity pattern 36 of aerial image 12 from the magnitudes of re-charging currents and the scanning pattern of tips 304 in the form of digitized aerial image 318. Image 318 exhibits an increased resolution $R_f$ in comparison with primary resolution $R_p$ of aerial image 12.

The resolution of this form of image sensing may depend on the diameter of the low voltage electron beam (for example, 10 to 50 V) used to re-charge the surface of photo-conducting layer 208. See, McCord and Pease (J. Vac, Sci. Tech.B Jan/Feb 1985) and Hordon (PhD. Dissertation, Stanford University, 1993). A resolution of 25 nm or better may be obtainable for an energy spread of 1 eV; better resolution is obtainable with electrons with a smaller energy spread as can be obtained from an NEA photocathode source.

The data which is representative of the aerial image may be collected using a scanning technique. Here, a complete image may be collected by scanning photo-conducting layer 208 with a sparse array of tips 304 in accordance with the techniques or principles described by G. Winograd, IEEE Photolithography Symposium, 1999, Anchorage, Alaska; also PhD Dissertation, Stanford University, 1999, hereinafter collectively "the Winograd materials"). The contents of the Winograd materials are incorporated herein by reference.

Figure 4:
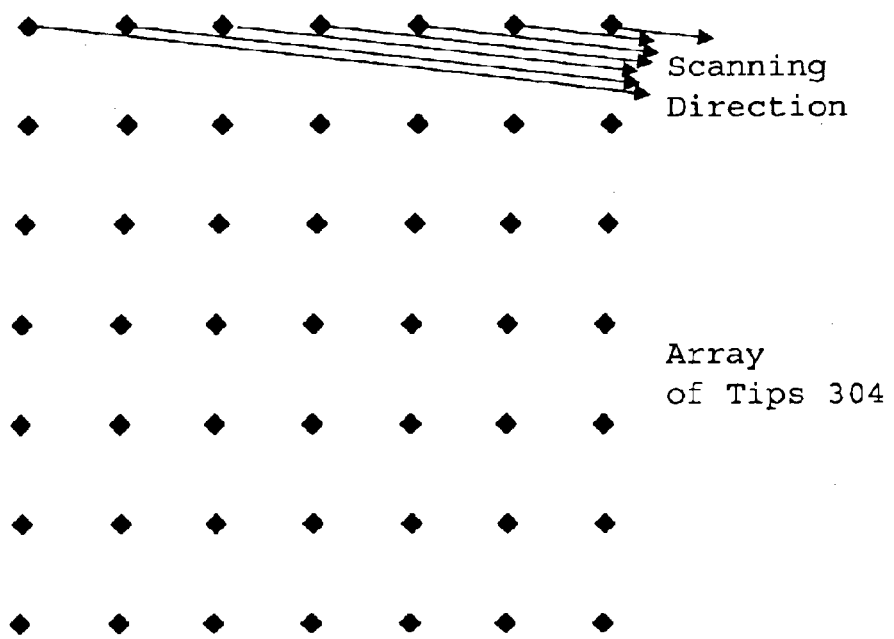
FIG. 4 is an illustration of an image scanning technique to collect data representative of the aerial image using a 2-dimensional array of tips or detectors.

In one particular embodiment, the complete image of the charge distribution on the surface of the photo-conducting layer is built up or collected by scanning a square array 304 in one direction only at a small angle to the array x-coordinate such that all y-adjacent pixels on the image on the photo-conducting layer 208 are covered by one tip as generally illustrated in FIG. 4. Notably, the Winograd materials describe other scanning strategies that may be suitable with the inventions described herein.

It should be noted that the embodiments of FIGS. 3A and 3B may also include a computer to implement, among other things, inspection algorithms (for example, die-to-die (D:D) inspection, die-to-database (D:DB) inspection, image self-analysis (SA) techniques, or inspection techniques that are combinations thereof) using the digitized aerial image 78. In addition, the embodiments of FIGS. 3A and 3B may include feedback circuitry and a controller, as illustrated in FIG. 1, and described relative thereto. As mentioned above, the controller may use this information to control (for example, set, align or re-align) stages 30 and 74, optics 20 and 32, and/or light source 16.

Figure 5:
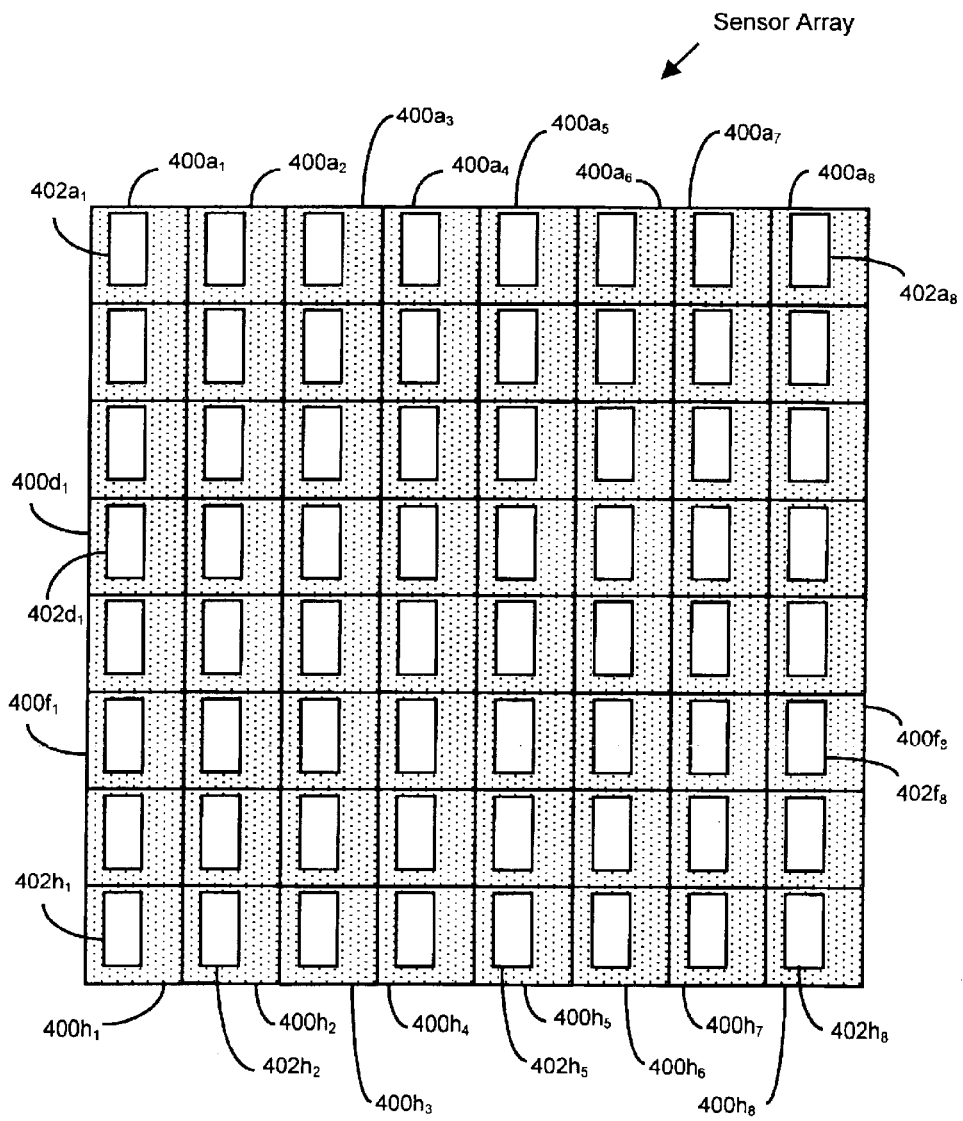
FIG. 5 is a block diagram representation of an array of photo-detectors according to one embodiment of the present invention.
Figure 6:
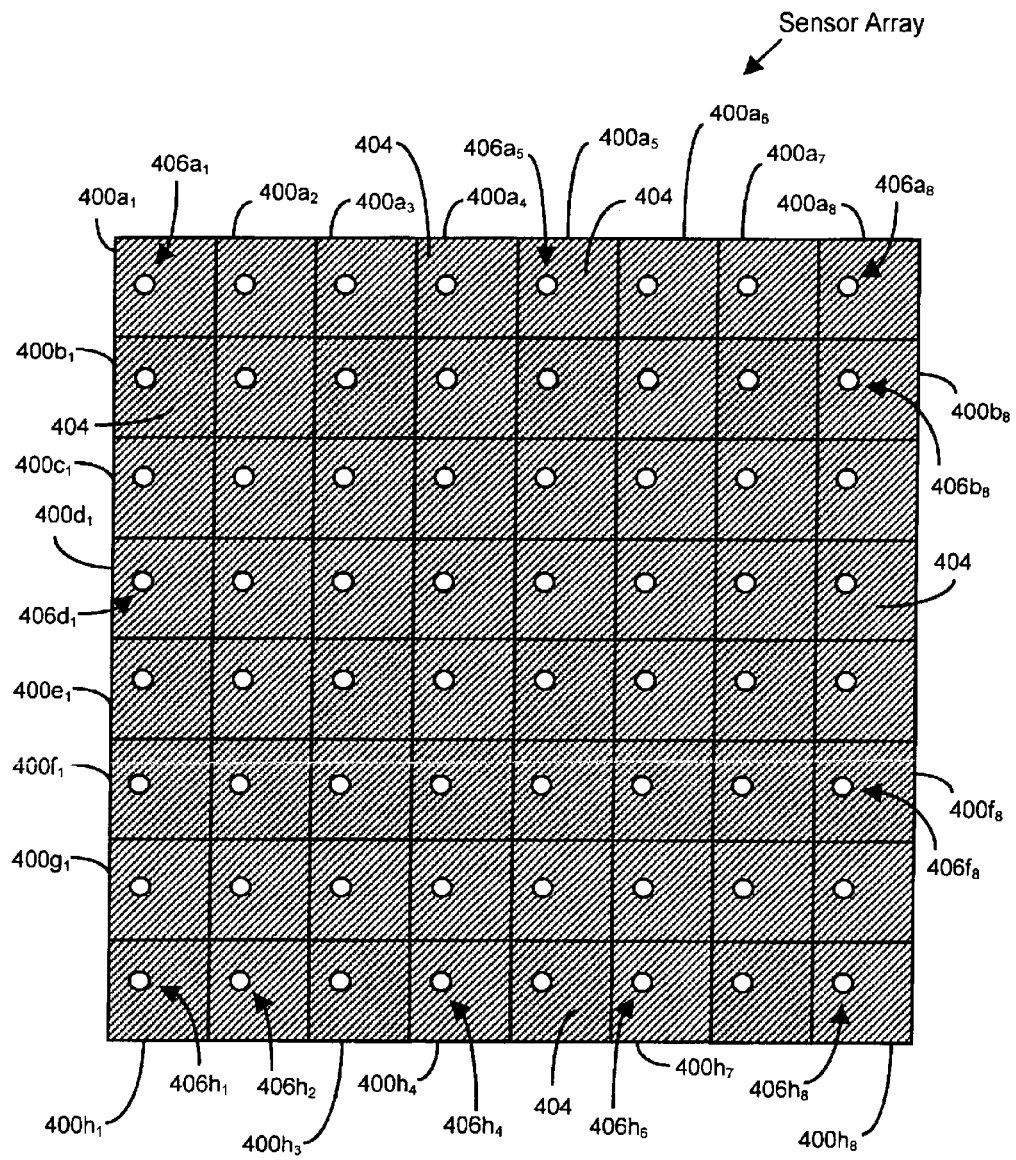
FIG. 6 is a two-dimensional (top view) schematic representation of the array of photo-detectors, in conjunction with a selectively patterned and/or milled film, according to one embodiment of the present invention.
Figure 7:
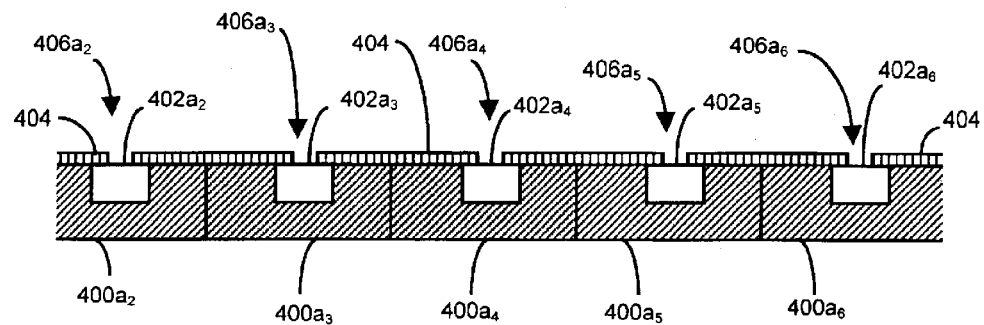
FIG. 7 is a cross-sectional view of a portion of the array of photo-detectors, in conjunction with a selectively patterned and/or milled film, according to one embodiment of FIG. 6.

In another embodiment, the present invention employs a sensor array of photo-detectors (for example, a CCD array) to sense the aerial image with a resolution that is finer than that of the visible or ultra-violet optics used to form the image. In this embodiment, each detector of the array is sensitive over a small restricted area corresponding to the desired resolution. With reference to FIGS. 5, 6 and 7, the sensor array may be a plurality of photo or photon sensitive detectors or sensor cells that sense incident energy or radiation, for example, incident visible or ultraviolet light (for example, deep ultraviolet light). The sensor array includes a plurality of sensor cells $400a_1$–$400a_8$, $400b_1$–$400b_8$, $400c_1$–$400c_8$, $400d_1$ to $400d_8$, $400e_1$–$400e_8$, $400f_1$–$400f_8$, $400g_1$–$400g_8$, and $400h_1$–$400h_8$, arranged or configured in a two dimensional array. The sensor cells $400a_x$–$400h_x$ (x=1 to 8) of the sensor array may be comprised of light or radiation sensing semiconductor devices, for example, CCDs, CMOS sensor cells and/or photo diodes.

It should be noted that while the sensor array of FIGS. 5, 6 and 7 is depicted as comprised of 64 sensor cells (i.e., an 8×8 array), in many situations, the sensor array includes thousands or millions of detectors or sensor cells.

With continued reference to FIGS. 5, 6 and 7, sensor cells $400a_x$–$400h_x$ (x=1 to 8) include active area $402a_x$–$402h_x$ (x=1 to 8), respectively. The active area $402a_x$–$402h_x$ is that portion or area of sensor cells $400a_x$–$400h_x$ (x=1 to 8), respectively, which is sensitive to the energy or radiation incident thereon. The sensor array further includes a patterned film 404 that impedes, obstructs, absorbs and/or blocks passage of photons or light of a given wavelength (that is, typically at the wavelength to be measured, sensed or detected by sensor cells $400a_x$–$400h_x$, x=1 to 8).

The film 404 includes apertures $406a_x$–$406h_x$ (x=1 to 8). The apertures $406a_x$–$406h_x$ (x=1 to 8) are configured or arranged to overlie a respective one of active area $402a_x$–$402h_x$ (x=1 to 8). In this way, film 404 overlies sensor cells $400a_x$–$400h_x$ (x=1 to 8) to partially cover active areas $402a_x$–$402h_x$ (x=1 to 8) and thereby limit the photosensitive area of active area $402a_x$–$402h_x$ (x=1 to 8) to the portion(s) effectively exposed by apertures $406a_x$–$406h_x$ (x=1 to 8). The portion of active area $402a_x$–$402h_x$ (x=1 to 8) that is covered by film 404 does not measure, sense, detect and/or collect incident energy or radiation or is substantially unaffected by such energy or radiation. As such, the spatial resolution of the energy measured by sensor cells $400a_x$–$400h_x$ (x=1 to 8) is enhanced or improved because the portion or area of the sensor cell that is effectively exposed to, and/or senses energy or radiation is limited or restricted.

In certain embodiments, it may be advantageous to selectively pattern film 404 to include apertures $406a_{x-406}h_x$ (x=1 to 8) that are located or positioned in, or near, the center of active areas $402a_x$–$402h_x$ (x=1 to 8). In this way, a significant number of photons that enter apertures $406a_x$–$406h_x$ (x=1 to 8) may be sensed by the underlying active areas $402a_x$–$402h_x$ (x=1 to 8), respectively, regardless of scattering caused or induced by apertures $406a_x$–$406h_x$ (x=1 to 8). In addition, locating or positioning apertures $406a_x$–$406h_x$ (x=1 to 8) at or near the center of active areas $402a_x$–$402h_x$ (x=1 to 8) may ease alignment constraints during fabrication of film 404.

The film 404 may be any material that may be deposited, grown and/or formed on or in sensor cells 400, and patterned, shaped and/or etched such that active areas 402 receive, measure, collect photons from a smaller, limited and/or restricted area or region (substantially or proportionally equal to the area of apertures 406 relative to the entire active area). For example, film 404 may be a metal film, such as platinum, of a sufficient thickness to alter, modify, impede, obstruct, absorbs and/or block photons or light (of at least a given wavelength) from being measured, sensed and/or detected by that portion of active area 402. In one embodiment, film 404 may be tungsten of a thickness in the range of 100 nm.

The apertures 406 in film 404 may be formed milling an aperture in film 404 using a focused beam of ions as described, for example, Pickard et al. (J. Vac. Sci. Tech. B (November/December 2000), which is incorporated herein by reference).

The size and shape of apertures 406 determine, to some extent, the number of photons sensed by sensor cells 400 and the maximum spatial frequency of the measured aerial image. In one embodiment, apertures 406 are substantially circular and have a diameter of between approximately 50 nm to approximately 125 nm, and preferably between about 75 nm to about 100 nm. An appropriate size of the diameter of apertures 406 may be determined using the wavelength of the photons of light 18 and the numerical aperture of lithographic equipment 14 (typical characterized as n (i.e., the refractive index of the medium above the sensor or wafer in lithographic equipment 14) x sin θ).

Thus, where the dimension size of active areas 402 of sensor cells 400 are in the order of a few μm by a few μm (for example, 2 μm×5 μm), and where a spatial resolution of between about 75 nm to about 100 nm is desired, required or advantageous, patterned film 404 (for example, tungsten, aluminum, or silicon) may be employed to limit or restrict the exposed active areas of sensor cells $400a_x$–$400h_x$ (x=1 to 8) thereby enhancing the spatial resolution of sensor cells $400a_x$–$400h_x$ (x=1 to 8). A spatial resolution of between about 75 nm and about 100 nm may be sufficient to properly, accurately and/or adequately characterize, measure, collect, sense and/or detect the aerial image of mask pattern 26 as projected at the image plane I.

Figure 8:
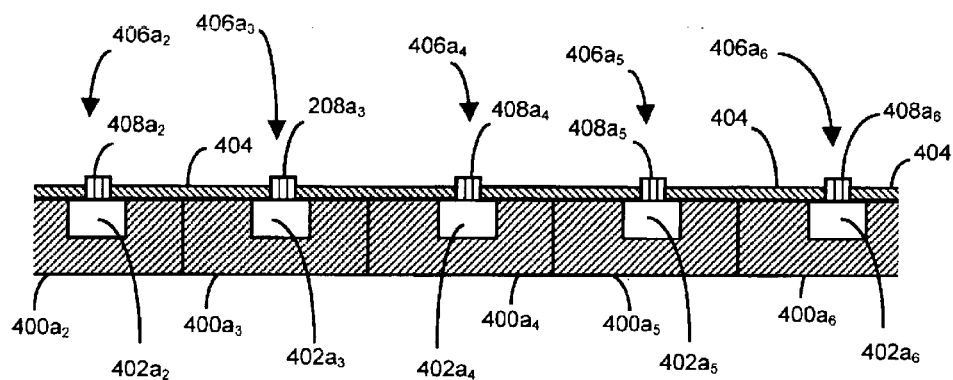
FIG. 8 is a cross-sectional view of a portion of the array of photo-detectors, in conjunction with photo detector enhancement material, according to one embodiment of the present invention.

It may be desirable, or in certain circumstances, advantageous, to enhance the photo-reception or photon efficiency of sensor cells 400. With reference to FIG. 8, in one embodiment, a photo or photon detection enhancement material $408a_x$–$408h_x$ (x=1 to 8) (for example, a photo or photon sensitive semiconductor material) may be deposited, grown and/or formed within aperture $406a_x$–$406h_x$ (x=1 to 8), respectively, to enhance the ability or capacity of sensor cells 400 to sense and/or detect incident photons or energy at a given wavelength (for example, $\lambda_0$). Thus, in this embodiment, detection enhancement material $408a_x-408h_x$ enhances the ability or capacity of active areas $402a_x-402h_x$ (x=1 to 8) to collect, measure, sense and/or detect incident radiation and thereby improve the ability or capacity of sensor cells 400 to characterize, measure, collect, sense and/or detect the aerial image of mask pattern 26 as projected at the wafer plane I.

With continued reference to FIG. 8, the detection enhancement material $408a_x-408h_x$ (x=1 to 8) may be deposited after formation or patterning of apertures $406a_x-406h_x$ (x=1 to 8).

In operation, as described above with respect to FIG. 4, the complete aerial image of this embodiment may again be "built-up" by scanning the array of photo detectors across the aerial image.

It should be noted that the restricted area of sensor cells 400 may be larger than the required resolution but sufficiently well-controlled that subsequent image processing could be used to bring about the required resolution. Such image processing could involve deconvolution or other techniques familiar to those skilled in the art of two-dimensional image processing.

Another technique to enhance the photo-reception efficiency of each photo-detector under the fine aperture is to make use of anomalously high transmission of light in arrayed apertures in metal films (see, for example "Extraordinary Optical Transmission through Sub-wavelength Hole Arrays", T. W. Ebbesen et al., Nature 391, 667, (1998) and "Control of Optical Transmission through Metals Perforated with Sub-wavelength Hole Arrays", T. J. Kim et al., Optics Let. 24 256 (1999), both of which are incorporated herein by reference).

It should be noted that in those instances where the sensor array includes more than one aperture for transmitting light to one photo-detector, deconvolution or other image processing may be employed to capture the aerial image. In those instances where more than one aperture per photo-detector is employed, such image processing may be avoided by using blind (partially milled) apertures or other surface modifications techniques.

Yet another technique for constructing the sparse photo detector array, each with a small restricted photo-sensitive area, is to employ fiber-based near-field scanning optical microscopy (NSOM) techniques in which sub-optical resolution is achieved using a tapered fiber (see, E. Betzig and J. K. Trautmann, Science, 275, 189, (1992), incorporated herein by reference).

There are many inventions described and illustrated herein. While certain embodiments, features, attributes and advantages of the inventions have been described and illustrated, it should be understood that many other, as well as different and/or similar embodiments, features, materials, attributes, structures and advantages of the present inventions, are apparent from the description, illustration and claims. As such, the embodiments, features, materials, attributes, structures and advantages of the inventions described and illustrated herein are not exhaustive and it should be understood that such other, similar, as well as different, embodiments, features, materials, attributes, structures and advantages of the present inventions are within the scope of the present invention.

It should be noted that while the present invention(s) is described generally in the context of integrated circuit fabrication, the present invention(s) may be implemented in processes to manufacture other devices, components and/or systems including, for example, hard disk drives, magnetic thin-film heads for hard disk drives, flat panel displays, and printed circuit board. Indeed, the present invention(s) may be employed in the fabrication of any devices, components and/or systems, whether now known or later developed, that may benefit (in whole or in part) from the present invention (s).

What is claimed is:

1. A system for sensing, at an increased resolution, an aerial image exhibiting a light intensity distribution at a primary resolution, the system comprising:
    a photo-electron emission unit to sense the aerial image and, in response, emit electrons in a pattern corresponding to the light intensity distribution of the aerial image;
    electron optics to project an enlarged pattern of the pattern of electrons emitted by the photo-electron emission unit;
    a sensing unit to sense the enlarged pattern; and
    an image analysis unit, coupled to the sensing unit, to digitize the enlarged pattern.

2. The system of claim 1 further comprising:
    an object;
    a light source to provide light;
    condensing optics to illuminate the object with the light; and
    an optical imaging and projection unit, wherein the optical imaging and projection unit projects the aerial image on the photo-electron emission unit.

3. The system of claim 2 wherein the photo-electron emission unit, electron optics and optical imaging and projection unit are disposed in or are a part of a photolithographic system.

4. The system of claim 3 wherein the photolithographic system is a stepper or a scanner.

5. The system of claim 4 wherein the object is a photo-lithographic mask.

6. The system of claim 5 further includes a computer to inspect the photolithographic mask using the digitized aerial image.

7. The system of claim 6 wherein the computer inspects the photolithographic mask using die-to-die inspection, die-to-database inspection, or image self-analysis techniques.

8. The system of claim 4 further includes a controller, coupled to the image analysis unit, to adjust the operation of the photolithographic stepper or the photolithographic scanner using at least a portion of the digitized aerial image.

9. The system of claim 4 wherein the light source provides a light that has a wavelength that is substantially equal to a wavelength of light that is used to expose a resist on a product wafer.

10. The system of claim 4 further includes a mechanical positioning unit wherein, the mechanical positioning unit, in response to an operator input, positions the photo-electron emission unit at an image plane.

11. The system of claim 4 further includes a mechanical positioning unit to position the photo-electron emission unit at an image plane to allow for in-situ aerial image sensing.

12. The system of claim 4 wherein the light has a wavelength in the UV range.

13. The system of claim 1 wherein the photo-electron emission unit includes an electron-multiplying cathode for amplifying the electrons.

14. The system of claim 13 wherein the electron-multiplying cathode allows the emission of substantially thermalized electrons.

15. The system of claim 1 wherein the photo-electron emission unit and the electron optics have a higher resolution than the resolution of the optical imaging and projection unit.

16. A system for sensing an aerial image exhibiting a light intensity distribution at a primary resolution, the system comprising:

a photo-conducting layer for projecting the aerial image thereon, wherein in response to the aerial image, the photo-conducting layer produces a depletion pattern corresponding to the light intensity distribution of the aerial image;

an electron source for providing electrons;

a steering device to direct the electrons to the photo-conducting layer to produce local re-charging currents in proportion to the local charge depletion;

amplifier circuitry coupled to the steering device, wherein the amplifier circuitry determines a pattern corresponding to the serial image using the re-charging currents; and an image analysis unit, coupled to the sensing unit, to digitize the pattern.

17. The system of claim 16 further comprising:

an object;

a light source to provide light;

condensing optics to illuminate the object with the light; and an optical imaging and projection unit to produce the aerial image on the photo-conducting layer.

18. The system of claim 17 wherein the photo-conducting layer, electron source, steering device and the optical imaging and projection unit are disposed in or are a part of a photolithographic system.

19. The system of claim 18 wherein the photolithographic system is a photolithographic stepper or a photolithographic scanner.

20. The system of claim 19 wherein the object is a photolithographic mask.

21. The system of claim 20 further includes a computer to inspect the photolithographic mask using the digitized aerial image.

22. The system of claim 21 wherein the computer inspects the photolithographic mask using die-to-die inspection, die-to-database inspection, or image self-analysis techniques.

23. The system of claim 19 further includes a controller, coupled to the image analysis unit, to adjust the operation of the photolithographic stepper or a photolithographic scanner using at least a portion of the digitized aerial image.

24. The system of claim 19 wherein the light source provides a light that has a wavelength that is substantially equal to a wavelength of light that is used to expose a resist on a product wafer.

25. The system of claim 19 further includes a mechanical positioning unit wherein, the mechanical positioning unit, in response to an operator input, positions the photo-electron emission unit at the an image plane.

26. The system of claim 19 further includes a mechanical positioning unit to position the photo-electron emission unit at the an image plane to allow for in-situ aerial image sensing.

27. The system of claim 19 wherein the light has a wavelength in the UV range.

* * * * *